US006374398B1

(12) United States Patent
Magee et al.

(10) Patent No.: US 6,374,398 B1
(45) Date of Patent: Apr. 16, 2002

(54) EFFICIENT DATABASE FOR DIE-PER-WAFER COMPUTATIONS

(75) Inventors: Michael R. Magee, Los Gatos; Michael D. Beer, San Jose; Wesley R. Erck, Danville, all of CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/474,392

(22) Filed: Dec. 28, 1999

(51) Int. Cl.[7] .......................... G06F 17/50; G06F 17/16; G06F 19/00
(52) U.S. Cl. ................. 716/21; 716/1; 716/4; 700/121; 700/96; 700/109
(58) Field of Search .................. 716/1–21; 700/95–121

(56) References Cited

U.S. PATENT DOCUMENTS

| 5,699,260 A | * 12/1997 | Lucas et al. ................. 700/121 |
| 5,828,578 A | * 10/1998 | Blomgren ....................... 716/3 |
| 5,838,951 A | * 11/1998 | Song ............................ 716/19 |
| 5,991,699 A | * 11/1999 | Kulkarni et al. ............... 702/83 |
| 6,113,646 A | * 9/2000 | Holden .......................... 716/4 |

FOREIGN PATENT DOCUMENTS

| EP | 709740 A1 * 5/1996 | ............. G03F/7/20 |

OTHER PUBLICATIONS

Schuelke et al., "Manufacturing cost analysis of optoelectronic integrated circuits", IEEE Transactions on Semiconductor Manufacturing, vol. 2, No. 1, Feb. 1989, pp. 29–31.*

Wein, "On the relationship between yield and cycle time in semiconductor wafer production", IEEE Transactions on Semiconductor Manufacturing, vol. 5, No. 2, May 1992, pp. 156–158.*

Ikota et al., "Discrimination of clustered defects on wafers using statistical methods", 1997 2nd International Workshop on Statistical Metrology, Jun. 8, 1997, pp. 52–55.*

* cited by examiner

Primary Examiner—Matthew Smith
Assistant Examiner—Phallaka Kik
(74) Attorney, Agent, or Firm—Wagner, Murabito & Hao LLP (57) ABSTRACT

A method and system thereof for efficiently computing the number of dies per wafer and the corresponding number of stepper shot counts. Dimensions for a die and the size of the wafer are received. The dimensions comprise a die element size that is a function of a scribe lane width, a guard ring width, an input/output pad area, and a length and a width of the die. A die count lookup table is selected for the specified wafer size and used to determine the die count corresponding to the die element size. In a similar manner, a stepper shot count lookup table is selected for the specified wafer size and used to determine the stepper shot count corresponding to the die element size. The axes of the die count and stepper shot count lookup tables are incremented by varying amounts; for example, the increments in one portion of the lookup tables are smaller (finer), and in another portion the increments are larger (grosser). By using larger increments in portions of the lookup tables, the amount of data in the tables can be reduced, making the tables easier to generate and work with.

27 Claims, 7 Drawing Sheets

EFFICIENT DATABASE FOR DIE-PER-WAFER COMPUTATIONS

TECHNICAL FIELD

The present invention relates to integrated circuit design and fabrication. More specifically, the present invention pertains to a method and system for calculating the number of integrated circuit dies per wafer and the stepper shot count for different wafer sizes using lookup tables.

BACKGROUND ART

Integrated circuit dies are fabricated en masse on silicon wafers using well-known techniques such as photolithography. Using these techniques, a pattern that defines the size and shape of the components and interconnects within a given layer of the die is applied to the wafer. The pattern applied to the wafer is laid out in an array, or matrix, of reticle images. A wafer stepper holds the pattern over a wafer and projects the pattern image of the reticle onto the wafer. The area on the wafer upon which the image is projected is defined as a stepper shot. A multitude of interconnecting layers, one formed on top of another, are essentially built up on the integrated circuit dies using several passes through the stepper.

The gross number of dies that can be produced from a single wafer is, as would be expected, dependent on the size and shape of the individual dies. The number of stepper shots is dependent on the number of die images that can be placed in the printable field of the reticle, which in turn is dependent on the size and shape of the individual dies. Therefore, the number of stepper shots is also dependent on the size and shape of the individual dies.

It may not always be desirable to maximize the number of dies produced per wafer. If the fabrication facility wafer steppers are not being used to capacity, then it generally is appropriate to adjust die size and shape to maximize the gross number of dies per wafer. On the other hand, if the fabrication facility is capacity limited by its wafer steppers, it may be more important to minimize the stepper shot count. When the fabrication facility is fully loaded, it may be beneficial to accept slightly fewer dies per wafer if the number of stepper shots is reduced as a result, thereby allowing more wafers to be processed during a given timeframe and consequently producing a greater number of total dies.

However, the prior art is problematic because decisions may be made in the design phase without fully considering the effect on the fabrication phase. In the prior art, the design phase and the fabrication phase of the integrated circuit die production process may be separate and independent from each other. In the design phase, the integrated circuit die must be designed to have a surface area large enough to accommodate the microcircuitry that will be included in the integrated circuit. The designer will typically choose dimensions that provide a size and shape that provide the required surface area, but may pay lesser regard to selecting dimensions that, along with providing the required surface area, also maximize the gross number of dies per wafer.

In some instances in the prior art, an effort may be made to coordinate the design phase with the fabrication phase. As might be expected, this coordination may not always take place. However, even in those cases where a more formal process is used to coordinate design and fabrication, the prior art is still problematic because the dimensions of the die are often chosen with the goal of maximizing the number of dies per wafer, without considering the number of stepper shots needed to produce the dies. As described above, it is not always desirable to maximize the number of dies produced per wafer.

In order to facilitate coordination between the design and fabrication processes, one solution is a method and system whereby a designer inputs proposed dimensions for a die and receives as output the results of a calculation of number of dies per wafer and stepper shot count. The designer can iterate using different dimensions until desirable values of the number of dies per wafer and stepper shot count are obtained. Additional information regarding this solution is provided in the copending patent application filed concurrently herewith, assigned to the assignee of the present invention, entitled "Method And System for Varying Die Shape to Increase Wafer Productivity," by Wesley R. Erck, Michael R. Magee, and Michael D. Beer, with Ser. No. 09/473,384, hereby incorporated by reference.

In one implementation of the solution described by this reference, lookup tables are used to compute the die count and the stepper shot count. These lookup tables are a function of the different parameters that can affect the number of die per wafer and the stepper shot count, such as the wafer size and production method (e.g., ceramic package, plastic package, narrow scribe, stepper type, and the like). Thus, a multiplicity of different lookup tables may be needed in order to account for the different parameters that can affect the results. For example, a die count lookup table and a stepper shot count lookup table are needed for each combination of the different parameters that can affect the results.

Furthermore, when a new parameter affecting the number of die per wafer or the stepper shot count is introduced, or when an existing parameter is changed to a new value, then a new lookup table needs to be generated, consuming time, computer processing resources, and file space. For example, if a new production method is implemented, new lookup tables need to be generated for each wafer size, etc.

One approach for reducing the number of lookup tables is provided in the copending patent application filed concurrently herewith, assigned to the assignee of the present invention, entitled "Computation of Die-Per-Wafer Considering Production Technology and Wafer Size," by Michael R. Magee, Michael D. Beer, and Wesley R. Erck, with Ser. No. 09/473,525, hereby incorporated by reference. This reference describes a method in which a "die element size" is used as the basis for the information in the lookup tables. The die element size is a function of scribe lane width, guard ring width, input/output pad area, and length and width of the die. The die element size thus accounts for the different production parameters, and therefore a die count lookup table and a stepper shot count lookup table are needed only for each wafer size. Consequently, the number of required lookup tables is reduced.

However, the lookup tables for each wafer size contain a large amount of data. Thus, each lookup table can take a relatively long period of time to generate, consuming a significant portion of a computer system's processing resources for an extended period of time. In addition, a large lookup table can also be somewhat cumbersome to work with, and so delays may be incurred when downloading a lookup table, reading it, and looking up and retrieving the information needed.

Accordingly, what is needed is a method and/or system that can facilitate coordination between the design and fabrication phases of integrated circuit die production and also can reduce the impact on computational resources, in particular with regard to the resources needed to generate, store and use lookup tables used to calculate die per wafer and stepper shot count as a function of die element size. The present invention provides a novel solution to the above needs.

These and other objects and advantages of the present invention will become obvious to those of ordinary skill in the art after having read the following detailed description of the preferred embodiments which are illustrated in the various drawing figures.

DISCLOSURE OF THE INVENTION

The present invention provides a method and system thereof that can facilitate coordination between the design and fabrication phases of integrated circuit die production and can reduce the impact on computational resources, in particular with regard to the resources needed to generate, store and use lookup tables used to calculate die per wafer and stepper shot count as a function of die element size.

The present embodiment of the present invention pertains to a method and system thereof for computing number of die per wafer and the associated stepper shot count. Dimensions for a die and the size of the wafer are received. The dimensions comprise a die element size that is a function of a scribe lane width, a guard ring width, an input/output pad area, and a length and a width of the die. A die count lookup table is selected for the specified wafer size and used to determine the die count corresponding to the die element size. One of the axes of the die count lookup table corresponds to the length-wise dimension of the die element size and the other axis of the die count lookup table corresponds to the width-wise dimension of the die element size. The size of the increments along the axes is varied. For example, the increments along the axes in one portion of the table are smaller (finer), and in another portion of the table the increments are larger (grosser).

In a similar manner, a stepper shot count lookup table is selected for the specified wafer size and used to determine the stepper shot count corresponding to the die element size. One of the axes of the stepper shot count lookup table corresponds to the length-wise dimension of the die element size and the other axis of the stepper shot count lookup table corresponds to the width-wise dimension of the die element size. Like the die count lookup table, the size of the increments along the axes is varied.

By using larger increments for the length-wise and width-wise die element dimensions in portions of the lookup tables, the amount of data contained in the tables can be reduced. Thus, the lookup tables can be more efficiently generated. In addition, the lookup tables will take up less storage space in a computer system, and will be easier to work with.

In one embodiment, a measure of die production is calculated using the die count and the stepper shot count. In one embodiment, the measure of die production is determined by dividing the die count by the stepper shot count. The die element size can be changed and a new measure of die production calculated, until a maximum value of the measure of die production is determined.

In one embodiment, the method is implemented on a server computer system in a client-server computer system network. In this embodiment, the server computer system receives from a client computer system the wafer size and die dimensions. The measure of die production is calculated and transmitted to the client computer system.

BRIEF DESCRIPTION OF THE DRAWINGS

The accompanying drawings, which are incorporated in and form a part of this specification, illustrate embodiments of the invention and, together with the description, serve to explain the principles of the invention.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, fragments, pixels, or the like.

As used herein, a transaction refers to the transmission or receipt of data or other such message information. The transaction may consist of all data associated with a particular computer system operation (e.g., a request or command). A transaction may also consist of a block of data associated with a particular operation; for example, a transfer of data may be broken down into several blocks of data, each block transferred prior to the transfer of a subsequent block, and each block making up a transaction.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "receiving," "using," "calculating," "retrieving," "building," "selecting," "storing" or the like, refer to actions and processes (e.g., the processes of FIGS. 4 and 5) of a computer system or similar electronic computing device. The computer system or similar electronic computing device manipulates and transforms data represented as physical (electronic) quantities within the computer system memories, registers or other such information storage, transmission or display devices. The present invention is well suited to the use of other computer systems.

The present invention is discussed in the context of a server computer system and a client computer system communicatively coupled via a client-server computer system network. The computer system network may be an Internet type of network, implemented over the World Wide Web for example. Alternatively, the computer system network may be an Intranet type of network, implemented within the boundaries of a company, for example, and therefore accessible only from within the company. However, it is appreciated that the present invention is suited for methods of implementation in other types of computer system networks, and the present invention is also suited for implementations other than in a computer system network.

Figure 1A:
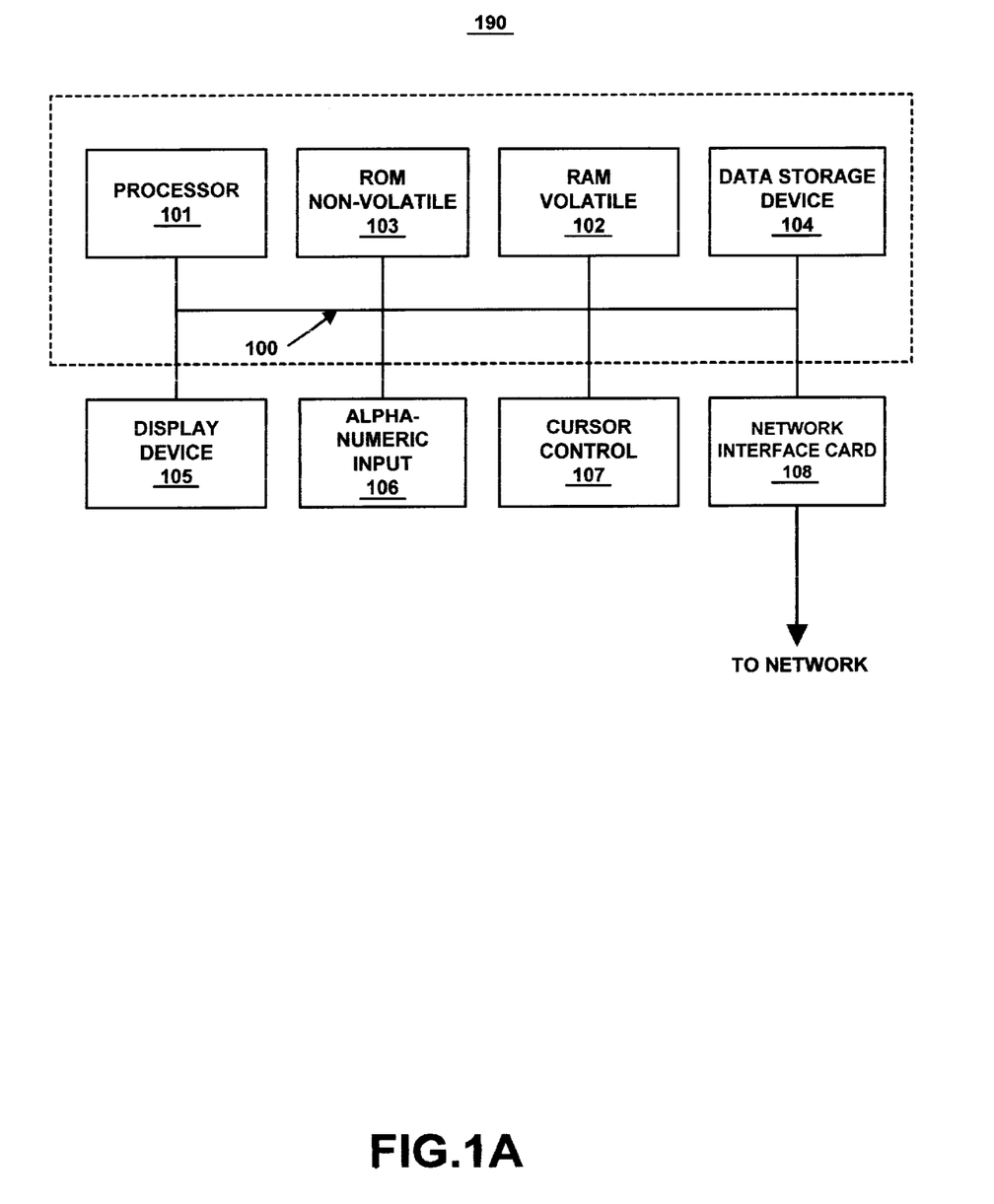
FIG. 1A is a block diagram of an exemplary computer system upon which embodiments of the present invention may be practiced.

Refer now to FIG. 1A which illustrates an exemplary computer system 190 upon which embodiments of the present invention may be practiced. In general, computer system 190 comprises bus 100 for communicating information, processor 101 coupled with bus 100 for processing information and instructions, random access (volatile) memory 102 coupled with bus 100 for storing information and instructions for processor 101, read-only (non-volatile) memory 103 coupled with bus 100 for storing static information and instructions for processor 101, data storage device 104 such as a magnetic or optical disk and disk drive coupled with bus 100 for storing information and instructions, an optional user output device such as display device 105 coupled to bus 100 for displaying information to the computer user, an optional user input device such as alphanumeric input device 106 including alphanumeric and function keys coupled to bus 100 for communicating information and command selections to processor 101, and an optional user input device such as cursor control device 107 coupled to bus 100 for communicating user input information and command selections to processor 101. Furthermore, a network interface card (NIC) 108 is used to couple computer system 190 onto, for example, a client-server computer system network. In such a network, computer system 190 can exemplify a client computer system and/or a server computer system.

Display device 105 utilized with computer system 190 may be a liquid crystal device, cathode ray tube, or other display device suitable for creating graphic images and alphanumeric characters recognizable to the user. Cursor control device 107 allows the computer user to dynamically signal the two-dimensional movement of a visible symbol (pointer) on a display screen of display device 105. Many implementations of the cursor control device are known in the art including a trackball, mouse, joystick or special keys on alphanumeric input device 106 capable of signaling movement of a given direction or manner of displacement. It is to be appreciated that the cursor control 107 also may be directed and/or activated via input from the keyboard using special keys and key sequence commands. Alternatively, the cursor may be directed and/or activated via input from a number of specially adapted cursor directing devices.

Figure 1B:
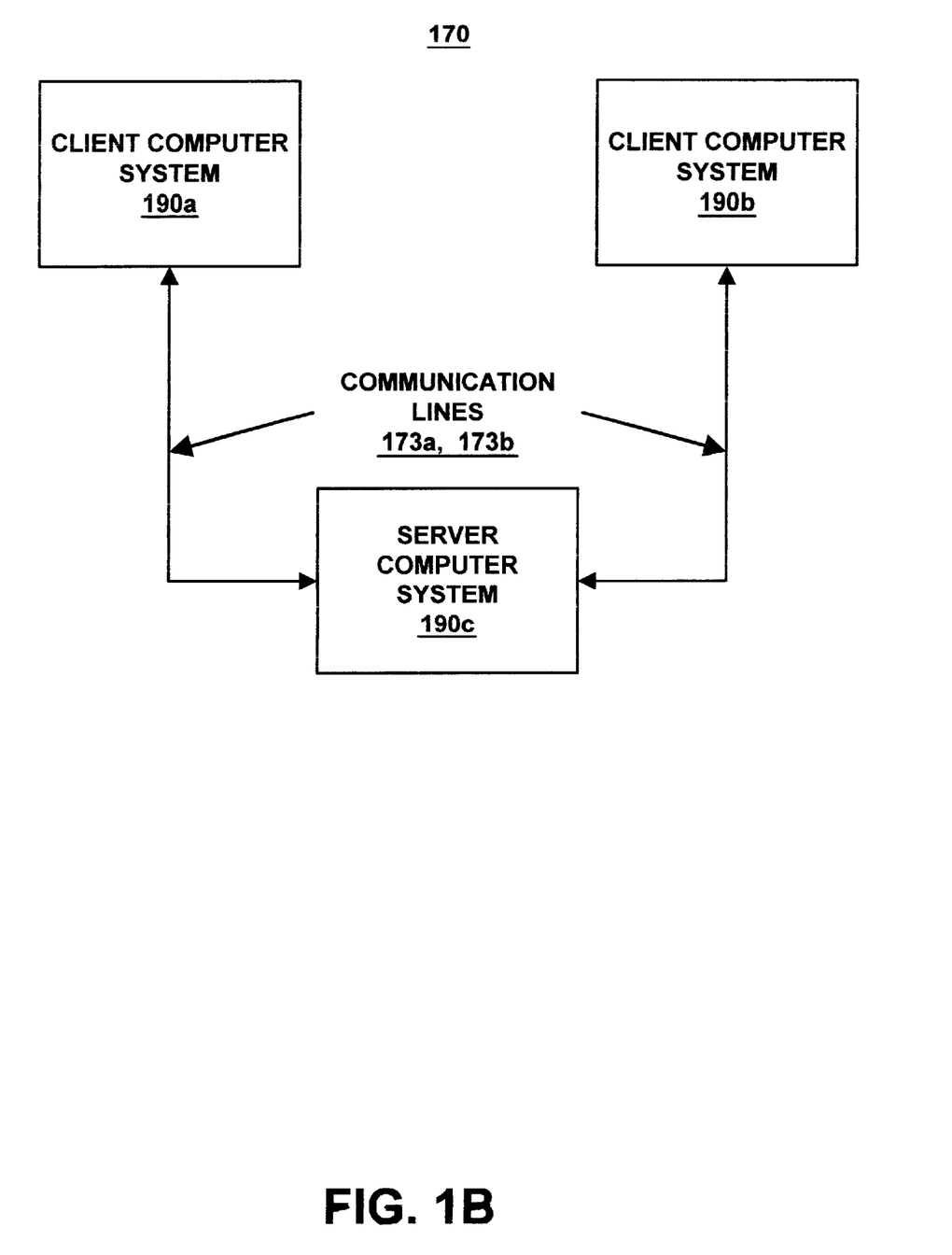
FIG. 1B is a block diagram illustrating an exemplary client-server computer system network upon which embodiments of the present invention may be practiced.

FIG. 1B is a block diagram illustrating an exemplary client-server computer system network 170 ("network 170") upon which embodiments of the present invention may be practiced. Network 170 may be a communication network located within a firewall of an organization or corporation. Client (or user) computer systems 190*a* and 190*b* and server computer system 190*c* are communicatively coupled via communication lines 173*a* and 173*b* through any of a variety of means known in the art. For example, this coupling can be accomplished over any network protocol that supports a persistent network connection, such as TCP (Transmission Control Protocol), NetBIOS, IPX (Internet Packet Exchange), and LU6.2, and link layers protocols such as Ethernet, token ring, and ATM (Asynchronous Transfer Mode). Alternatively, client computer systems 190*a* and 190*b* can be coupled to server computer system 190*c* via an input/output port (e.g., a serial port) of server computer system 190*c*.

Figure 2:
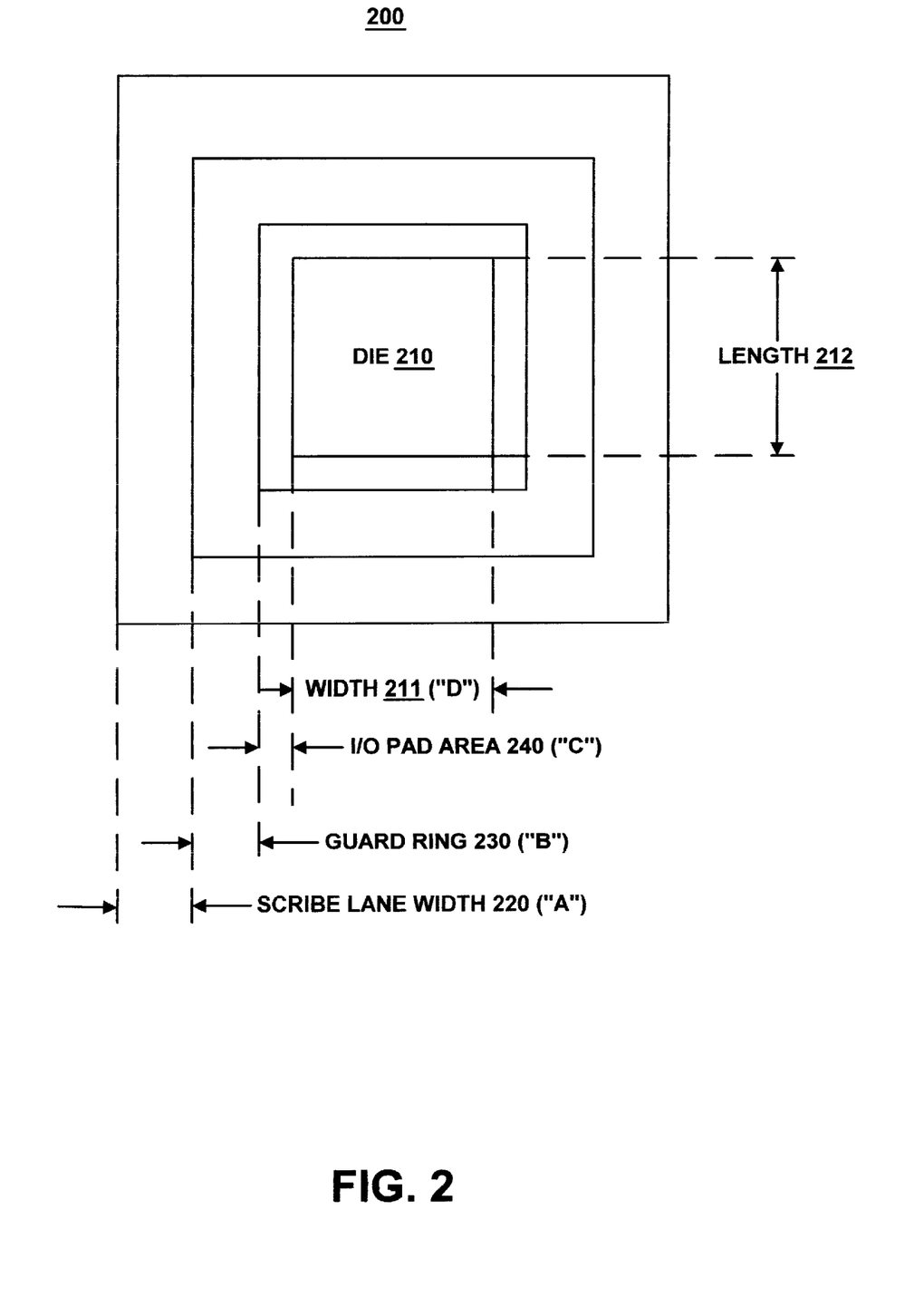
FIG. 2 shows the general layout of a single integrated circuit die layout in accordance with one embodiment of the present invention.

FIG. 2 shows the general layout of a single integrated circuit die element 200 on a wafer (not shown). Die element 200 comprises integrated circuit die 210, which has a length 212 and width 211. Die 210 is surrounded by an input/output (I/O) pad area 240, a guard ring 230, and a scribe lane width 220. The scribe lane contains inserts and production marks (not shown) used during the manufacture of integrated circuit dies from a wafer. When die layout 200 is stepped around the wafer during manufacture, the scribe lane is overlaid from side to side and from top to bottom. As is known in the art, scribe lane width 220 and the width of guard ring 230 are each a function of the type of production method being used (e.g., ceramic package, plastic package, narrow scribe, stepper type, and the like).

The number of dies 210 that can be manufactured on a wafer requires consideration of the size of die element 200, including not only the length 212 and width 211 of die 210 but also the scribe lane width 220 (and thus the production method), the I/O pad area 240, and the width of guard ring 230 (and thus the production method). In the present embodiment, the size of die element 200 is determined by the following formula:

$$\text{die element size} = A + 2*B + 2*C + D;$$

where:

A = scribe lane width 220;

B = width of guard ring 230;

C = I/O pad area 240; and

D = die width 211 or die length 212.

In the present embodiment, die element size 200 is calculated as a function of die width 211 and as a function of die length 212. The length and width values for die element size 200 are used as the lookup values in a die count lookup table and in a stepper shot count lookup table. The use of die element size 200 in this manner means that different die count lookup tables and different stepper shot count lookup tables are only needed for different wafer sizes. That is, separate lookup tables for each of the other parameters that can affect the number of dies per wafer, such as production method, are not required, as such parameters are already included in the determination of die element size 200. Additional information is provided in conjunction with FIG. 4.

Figure 3:
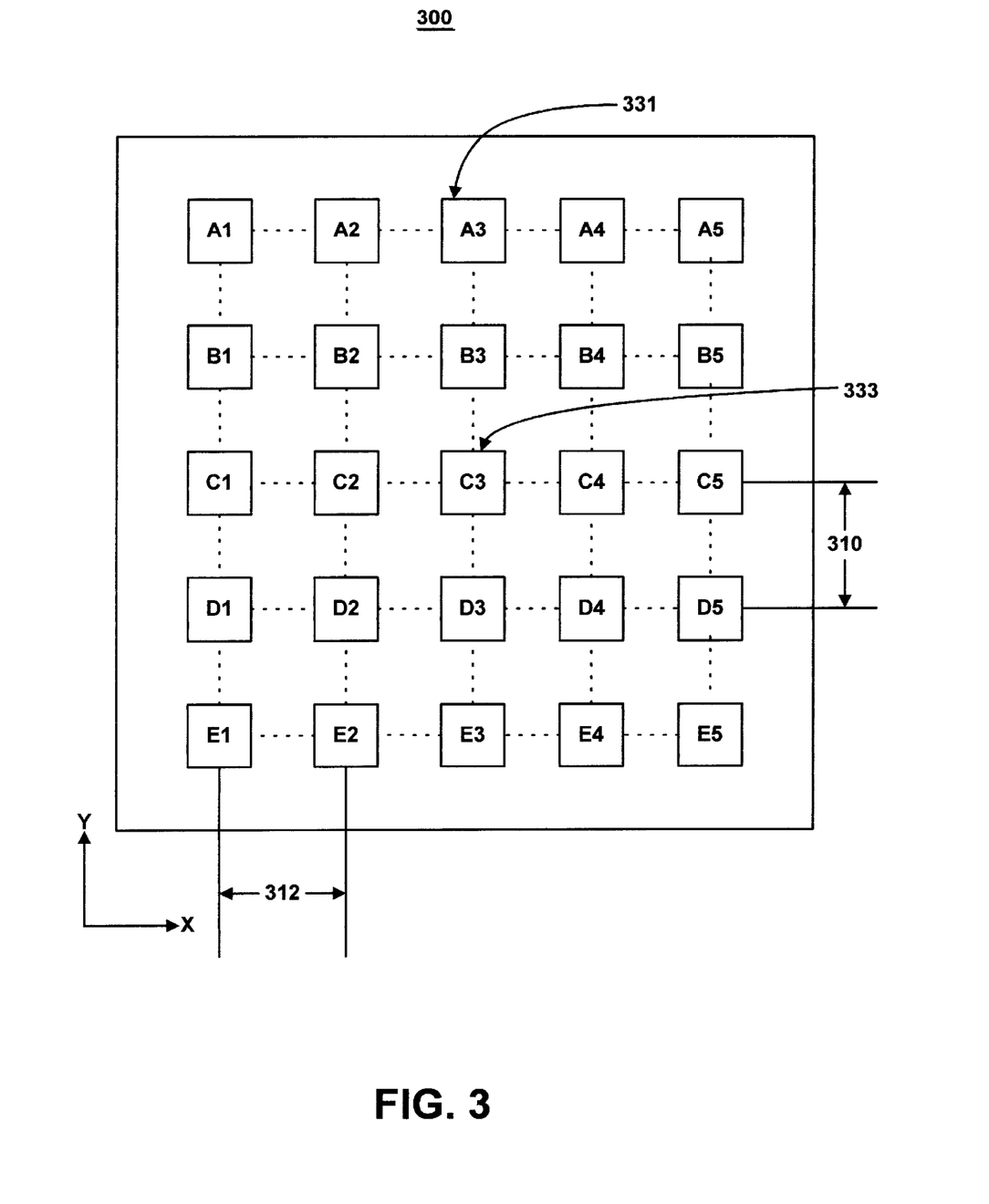
FIG. 3 illustrates a top view of one shot of a die matrix of reticle images in accordance with one embodiment of the present invention.

With reference now to FIG. 3, one shot of a die matrix 300 (a matrix of reticle images) is shown in accordance with one embodiment of the present invention. FIG. 3 shows a top view of die matrix 300. Typically, die matrix 300 includes a multiple number of rows and columns of pattern boxes (exemplified by 331 and 333); however, it is appreciated that a die matrix may include only a single row and/or a single column. In FIG. 3, a five-by-five matrix is shown; however, it is appreciated that other matrix sizes may be used in accordance with the present invention. The pattern boxes are separated from one another by a constant pitch 310 in one direction (e.g., the y-direction) and a constant pitch 312 in the other direction (e.g., the x-direction), although the pitch can be variable in other embodiments. It is appreciated that the pitches 310 and 312 are exaggerated in FIG. 3 for purposes of clarity. In addition, while the present embodiment shows a specific configuration and spacing of regularly shaped pattern boxes, in other embodiments the die matrix may have other patterns, configurations and spacing.

Figure 4:
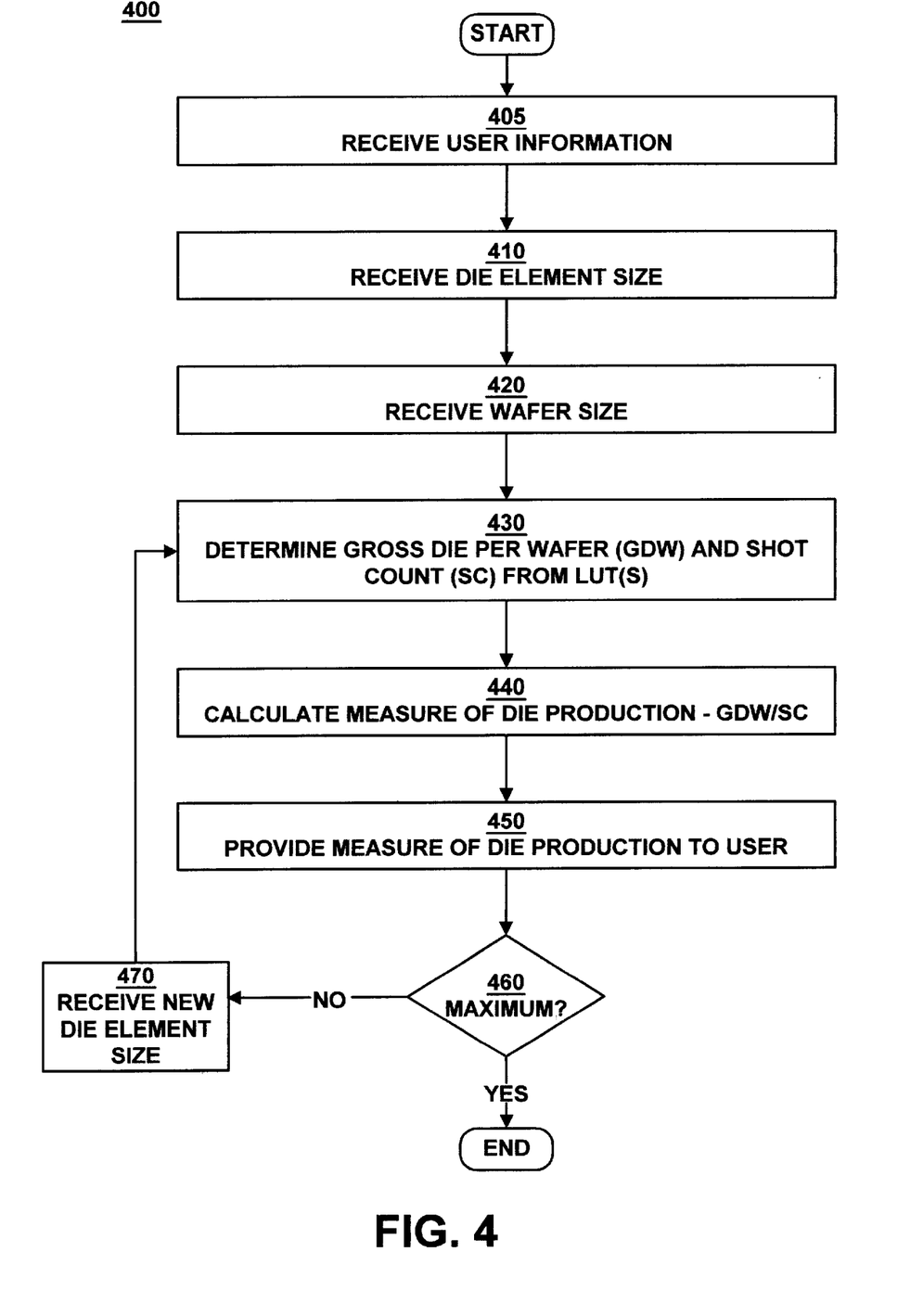
FIG. 4 is a flowchart of the steps in a process for calculating the number of integrated circuit dies per wafer and the stepper shot count in accordance with one embodiment of the present invention.

FIG. 4 is a flowchart of the steps in a process 400 for computing the number of dies per wafer and the corresponding number of stepper shot counts. Process 400 can be implemented via computer-readable program instructions stored in a memory unit (e.g., random access memory 102, read-only memory 103, and/or data storage device 104) and executed by processor 101 of computer system 190 (FIG. 1A).

In one embodiment, process 400 is implemented on a server computer system exemplified by computer system 190. In this embodiment, a user accesses the server computer system from a client computer system communicatively coupled to the server computer system via a client-server computer system network (e.g., network 170 of FIG. 1B). Such client-server computer system networks are well known in the art.

In step 405 of FIG. 4, the user provides user information such as a user identification ("user ID"), a part number, the user's location, and other like information that can be used for logon purposes, as well as for purposes of maintaining logs and records. In one embodiment, this information is input by the user from a client computer system and received at the server computer system in accordance with the present invention.

In step 410, a proposed size for the integrated circuit die element (e.g., die element 200 of FIG. 2) is received from the user. As above, in one embodiment, the user inputs this information at a client computer system, and the information is received at the server computer system. In the present embodiment, the user indicates the length 212 and width 211 of die 210 (FIG. 2) and the wafer size. In one embodiment, the user can also specify scribe lane width 220. In another embodiment, the user specifies the production method (e.g., ceramic package, plastic package, narrow scribe, stepper type, and the like). In one embodiment, the different types of production methods are each uniquely identified and listed in a database with their respective scribe lane width and guard ring width. In that embodiment, a user specifies the production method by selecting its identifier, and the scribe lane width and guard ring width associated with the selected production method are retrieved from the database.

In the present embodiment, with reference to FIG. 2, the size of die element 200 is determined by the following formula:

$$\text{die element size} = A + 2*B + 2*C + D;$$

where:
A=scribe lane width 220;
B=width of guard ring 230;
C=I/O pad area 240; and
D=die width 211 or die length 212.

It is appreciated that, in addition to indicating the die width 211, die length 212 and/or scribe lane width 220, the user can also input values for the width of guard ring 230 and I/O pad area 240. Furthermore, it is appreciated that the user can specify a single value for a combination of the variables in the above formula (for example, a single value for I/O pad area 240 plus die width 211 or die length 212), and this value will be used in the above formula accordingly.

In step 420 of FIG. 4, the wafer size that will be used for the fabrication of the integrated circuit dies is received. In the present embodiment, the wafers are either six inches or eight inches in diameter; however, it is appreciated that other sizes may be used in accordance with the present invention. In one embodiment, the wafer size is specified by the user as described above.

In step 430, in the present embodiment of the present invention, the gross number of dies per wafer ("die count") is determined from a lookup table using the die element size specified in step 410. The die count lookup table also corresponds to the wafer size specified in step 420. In the present embodiment, the die count lookup table is a function only of the wafer size; that is, separate lookup tables are not needed to account for production method or other parameters that can affect the die count.

In the present embodiment, the die count lookup table is an array with the length-wise dimensions incremented along one axis and the width-wise dimensions incremented along the other. In accordance with the present invention, the size of the increments along the axes is varied. For example, the increments along the axes in one portion of the table are smaller (finer), and in another portion of the table the increments are larger (grosser). Additional information is provided in conjunction with FIG. 6.

By using larger increments for the die element size in portions of the lookup tables, the amount of data contained in the tables can be reduced. Thus, the lookup tables can be more quickly and efficiently generated, requiring less use of a computer system's resources. In addition, the lookup tables will take up less storage space in a computer system, and will be easier to work with. For example, the lookup tables can be downloaded and read more quickly, and information needed from the lookup table can be found and retrieved faster. If a dimension is specified that falls within the range between increments, the dimension is rounded up to the next highest value in order to provide a conservative prediction of the number of dies that will fit on the wafer.

Also in step 430, the number of stepper shots ("stepper shot count") associated with the die dimensions of step 410 is determined from a stepper shot count lookup table in a manner similar to that described in the preceding paragraph. In the present embodiment, the stepper shot count lookup table is a function only of the wafer size; that is, separate lookup tables are not needed to account for production method or other parameters that can affect the stepper shot count. Similar to the die count lookup table, the stepper shot count lookup table is an array with the length-wise dimensions incremented along one axis and the width-wise dimensions incremented along the other. In accordance with the present invention, the size of the increments along the axes is varied.

In the present embodiment, separate lookup tables are used to determine the number of dies per wafer and the number of stepper shots. However, it is appreciated that, in other embodiments, the die count and stepper shot count lookup tables may be combined.

In step 440, in one embodiment, a measure of die production is calculated. In this embodiment, the measure of die production is wafer productivity, which is the gross number of dies per wafer (step 430) divided by the number of stepper shots (step 430). However, it is appreciated that, in other embodiments, other measures of die production may be used in accordance with the present invention.

In step 450, the wafer productivity calculated in step 440 is provided and displayed to the user. In one embodiment, the user receives this information at a client computer system from a server computer system.

In steps 460 and 470, the user may change the proposed size of the integrated circuit die in order to calculate a new value of wafer productivity. Thus, process 400 is an iterative process in which varying die dimensions are input by a user until a maximum or nearly maximum value of wafer productivity is determined.

Because many stepper field limits are rectangular, it is possible to see an increase in wafer productivity by rotating the dimensions of a non-square die element. In one embodiment, the present invention automatically rotates the specified dimensions for die element 200 (from step 410) by 90 degrees—that is, the die element size specified as a function of length is made a function of the width, and vice versa. The number of dies per wafer, the number of stepper shots, and the resultant wafer productivity are calculated for the rotated dimensions. If the rotated dimensions yield a higher value for wafer productivity, this is reported to the user with a suggestion to rotate the die by 90 degrees for fabrication.

Once a maximum value of wafer productivity is determined, the user can terminate process 400. The die element size, including the associated length and width for the integrated circuit die, corresponding to the maximum value of wafer productivity can then be used in the remainder of the design process.

Figure 5:
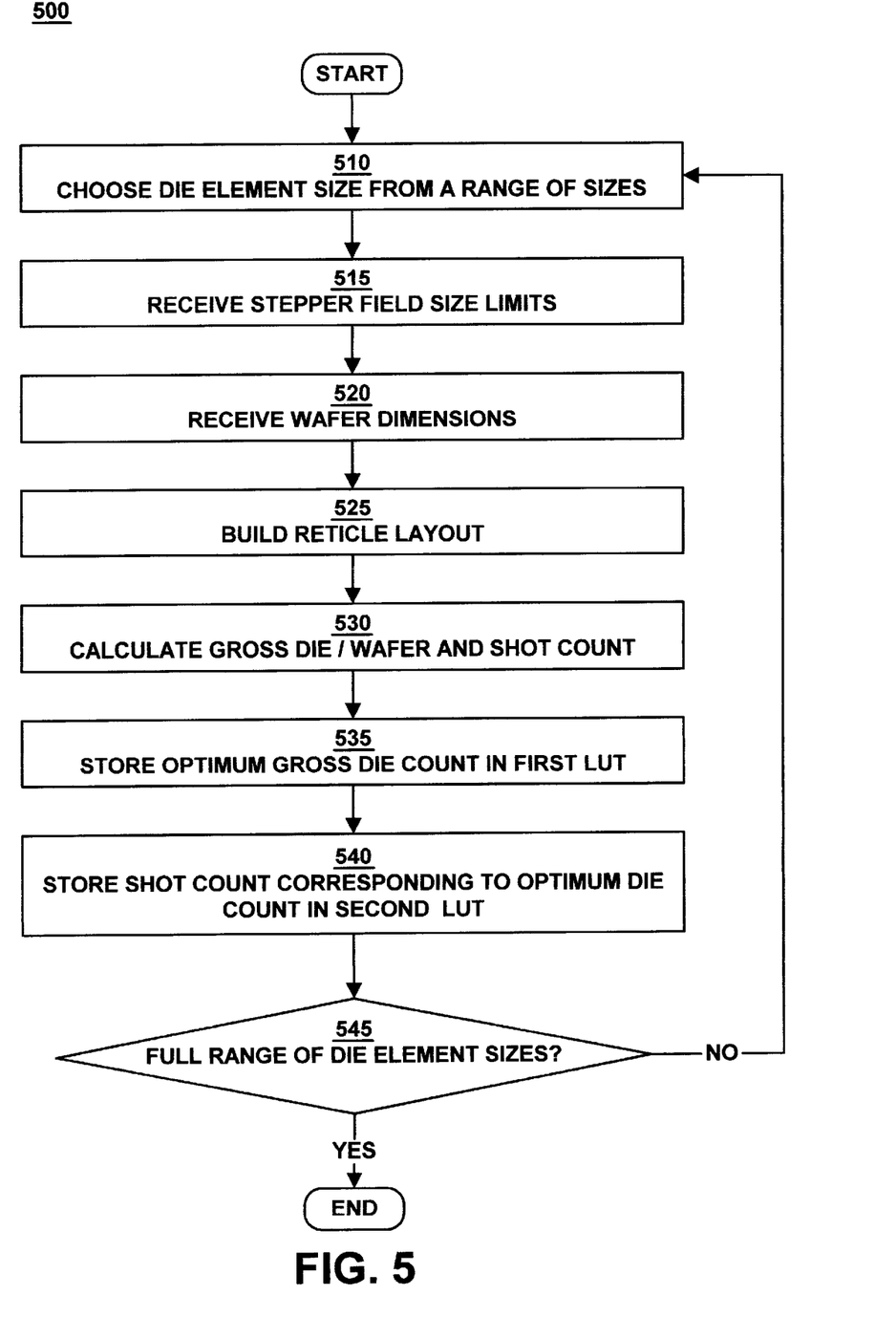
FIG. 5 is a flowchart of the steps in a process for generating lookup tables used in the process of FIG. 4 in accordance with one embodiment of the present invention.

FIG. 5 is a flowchart of the steps in a process 500 for generating lookup tables used in process 400 (FIG. 4) in accordance with one embodiment of the present invention. Process 500 can be implemented via computer-readable program instructions stored in a memory unit (e.g., random access memory 102, read-only memory 103, and/or data storage device 104) and executed by processor 101 of computer system 190 (FIG. 1A). Note that, in the present embodiment, it is not necessary for process 500 to be implemented on the same computer on which process 400 is implemented. Instead, the lookup tables can be generated using process 500 and stored on one computer system, and then accessed by another computer system that is implementing process 400.

In step 510 of FIG. 5, in the present embodiment, a range of possible die element sizes (see FIG. 2) is identified. That is, the range of die element sizes to be stored in the lookup tables is identified. For example, the minimum possible and maximum possible die element sizes as a function of die length, die width, scribe lane width, etc., are identified. A set of die element sizes is selected from the range identified. For example, the first set of die element sizes could correspond to the minimum length and the minimum width of the die for the range being considered.

In step 515, the stepper field size limit is specified. In one embodiment, the different types of wafer steppers that are used in fabrication are each uniquely identified and listed in a database with their respective stepper field size limit. In this embodiment, a user specifies the type of wafer stepper by selecting its identifier, and the stepper field size limit associated with the selected stepper is retrieved from the database.

In step 520, the wafer dimension (e.g., six-inch or eight-inch diameter) is specified.

In step 525, a die matrix (e.g., die matrix 300 of FIG. 3) is modeled using the set of die element sizes from step 510 and stepper field size limit (step 515).

In step 530, the die matrix is overlaid on the wafer using a prescribed offset relative to a fixed location on the wafer. For example, the offset may be measured relative to the center of the wafer. The amount of offset is specified for the x-direction and the y-direction (see FIG. 3). The offset can be initially prescribed to be zero in both the x-direction and the y-direction, for example, in which case the center of the matrix of reticle layouts lies over the center of the wafer.

Continuing with step 530 of FIG. 5, the gross number of die per wafer and the number of stepper shots are calculated for the prescribed offset using the present layout for the die matrix (step 525, which incorporates the die element size and stepper field size limit) and the present wafer diameter (step 520).

If the offset is not at its maximum value, a new value is specified for the offset, and the gross number of die per wafer and the number of stepper shots are calculated for the new offset using the present die matrix and wafer diameter. A new value of the offset is specified, for example, by maintaining the same offset in the x-direction and increasing the offset in the y-direction. When the offset in the y-direction reaches its maximum value, the 'y' value is reset to its initial value and the 'x' value is increased. These steps are repeated until the full range of offsets is evaluated. Thus, for each offset evaluated, the die count per wafer and the shot count are determined using the present values for die element size, wafer size, and stepper field size limit.

In step 535, in the present embodiment, once the full range of offsets have been considered, the optimum value for the die count corresponding to the present value for die element size (step 510) is stored in a first lookup table. The optimum value may be the maximum value calculated for the die count, although it is appreciated that it may not necessarily be the maximum value. For example, the maximum die count may correspond to a particular amount of offset, but a slight deviation from that particular offset may significantly affect the die count. In this case, it might be more desirable to select a die count not as significantly affected by deviations in the offset.

In step 540, in the present embodiment, the stepper shot count corresponding to the die count selected in step 535 is stored in a second lookup table. It is appreciated that, in other embodiments, the lookup tables may be combined.

In step 545, if the full range of die element sizes specified in step 510 has been evaluated, process 500 is terminated. If the full range of die element sizes has not been evaluated, then the length and/or width is increased by an incremental amount, and a value of optimum die count and the corresponding shot count are calculated for the new length and width and stored in lookup tables, as described above.

As described previously herein (see also FIG. 6), the lookup tables are arrays with the length-wise die element dimensions incremented along one axis and the width-wise element die dimensions incremented along the other axis. In accordance with the present invention, the size of the increments along the axes if varied. For example, the increments along the axes in one portion of the table are smaller (finer), and in another portion of the table the increments are larger (grosser). Additional information regarding the structure of the lookup tables is provided in conjunction with FIG. 6.

Continuing with reference to FIG. 5, steps 510 through 540 of process 500 are repeated until the full range of die element sizes is evaluated. Process 500 is performed for each different wafer size so that a lookup table is generated for each wafer size. The lookup tables contain the optimum die count or stepper shot count for a full range of die element sizes for each wafer size.

Figure 6:
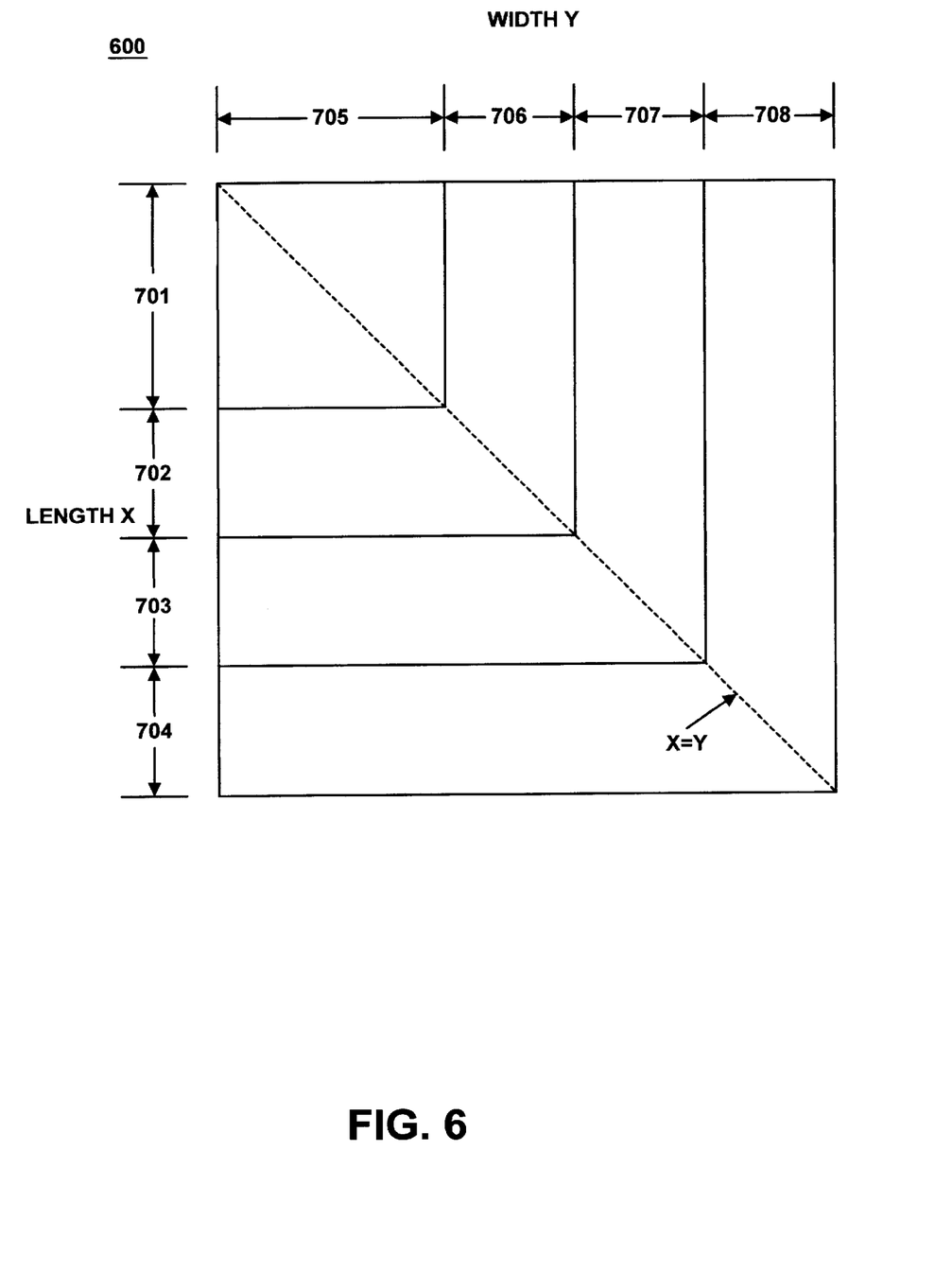
FIG. 6 illustrates a lookup table used in the processes of FIGS. 4 and 5 in accordance with one embodiment of the present invention.

FIG. 6 is an illustration of one embodiment of a lookup table 600 used for die-per-wafer and stepper shot count calculations in accordance with the present invention. Lookup table 600 exemplifies the die count lookup table and the stepper shot count lookup table used in processes 400 (FIG. 4) and 500 (FIG. 5).

With reference to FIG. 6, lookup table 600 is essentially an array of values (either die count or stepper shot count) arranged as a function of the length x and the width y of a die element. The length-wise dimensions are incremented along one axis of lookup table 600, and the width-wise dimensions are incremented along the other axis.

In accordance with the present invention, the increments along the axes of lookup table 600 are different for different portions of the table. In the present embodiment, the increments in length range 701 and width range 705 are of a certain size (e.g., $\Delta_1$, where $\Delta$ is typically measured in mils). The increments in length range 702 and width range 706 are of a different size (e.g., $\Delta_2$, where $\Delta_2$ is greater than $\Delta_1$). Similarly, an increment of $\Delta_3$ is used for length range 703 and width range 707 and an increment of $\Delta_4$ is used for length range 704 and width range 708, where $\Delta_4$ is greater than $\Delta_3$ and $\Delta_3$ is greater than $\Delta_2$. However, it is appreciated that in other embodiments, the size of the increments does not necessarily have to increase as length x and width y increase. For example, $\Delta_3$ could be less than $\Delta_2$.

In the present embodiment, each portion of lookup table 600 is square with a diagonal in which length x is equal to width y, so that each length range is equal to the corresponding width range (for example, length range 701 is equal to width range 705). However, it is appreciated that in other embodiments, each portion of lookup table 700 does not necessarily have to be square-shaped. That is, for example, length range 701 does not necessarily have to be equal to width range 705.

By varying (e.g., increasing) the increments for the die element size in portions of the lookup tables, the amount of data (e.g., die-per-wafer and stepper shot count as a function of die element size) contained in the tables can be reduced. Thus, the lookup tables can be more quickly and efficiently generated, requiring less use of a computer system's resources. In addition, the lookup tables will take up less storage space in a computer system, and will be easier to work with. For example, the lookup tables can be downloaded and read more quickly, and information needed from the lookup table can be found and retrieved faster.

The present invention thus provides a method and system thereof that can facilitate coordination between the design and fabrication phases of integrated circuit die production and can reduce the impact on computational resources, in particular with regard to the resources needed to generate, store and use lookup tables used to calculate die per wafer and stepper shot count as a function of die element size.

The preferred embodiment of the present invention, efficient database for die-per-wafer computations, is thus described. While the present invention has been described in particular embodiments, it should be appreciated that the present invention should not be construed as limited by such embodiments, but rather construed according to the following claims.

What is claimed is:

1. A method for efficiently computing a number of integrated circuit dies, said method comprising the steps of:
   a) receiving dimensions for a die;
   b) receiving a wafer size;
   c) using only said wafer size, selecting a die count lookup table, wherein a first axis of said die count lookup table corresponds to a length-wise dimension for said die and a second axis of die count lookup table corresponds to a width-wise dimension for said die, said first axis and said second axis having increments of varying amounts; and
   d) determining from said selected die count lookup table, a die count corresponding to said dimensions.

2. The method for efficiently computing a number of integrated circuit dies as recited in claim 1 further comprising the steps of:
   e) using only said wafer size, selecting a stepper shot count lookup table, wherein a first axis of said stepper shot count lookup table corresponds to a length-wise dimension for said die and a second axis of stepper shot count lookup table corresponds to a width-wise dimension for said die, said first axis and said second axis having increments of varying amounts; and
   f) determining from said selected stepper shot count lookup table, a stepper shot count corresponding to said dimensions.

3. The method for efficiently computing a number of integrated circuit dies as recited in claim 2 further comprising the steps of:
   g) calculating a measure of die production using said die count and said stepper count;
   h) receiving changed dimensions and repeating said steps a) through g) for said changed dimensions; and
   i) repeating said steps a) through h) until a maximum value of said measure of die production is determined.

4. The method for efficiently computing a number of integrated circuit dies as recited in claim 3 wherein said dimensions comprise a die element size for said die, said die element size being a function of a scribe lane width, a guard ring width, an input/output pad area, and a length and a width of said die.

5. The method for efficiently computing a number of integrated circuit dies as recited in claim 4 wherein said step c) further comprises the steps of, for each wafer size:
   c1) receiving a stepper field size;
   c2) building a die matrix of reticle images using said die element size;
   c3) calculating a die count for each of a plurality of different offsets of said die matrix, said offsets measured relative to a fixed location on a wafer;
   c4) selecting an optimum die count from said step c3); and
   c5) storing said optimum die count in said die count lookup table, said optimum die count corresponding to said die element size.

6. The method for efficiently computing a number of integrated circuit dies as recited in claim 5 further comprising the steps of:

c6) calculating a stepper shot count for an offset corresponding to said optimum die count; and c7) storing said stepper shot count for said offset in said stepper shot count lookup table.

7. The method for efficiently computing a number of integrated circuit dies as recited in claim 3 wherein said step g) comprises the step of:

calculating said measure of die production by dividing said die count by said stepper shot count.

8. The method for efficiently computing a number of integrated circuit dies as recited in claim 3 wherein said step h) comprises the step of:

automatically rotating said dimensions for said die by 90 degrees when a width and a length of said die are not equal.

9. The method for efficiently computing a number of integrated circuit dies as recited in claim 3 wherein said method is implemented in a server computer system in a client-server computer system network, said server computer system receiving said dimensions and said wafer size from a client computer system and providing said measure of die production to said client computer system.

10. A computer system comprising:

a bus;

a processor coupled to said bus; and a memory unit coupled to said bus, said processor for executing a method for efficiently computing a number of integrated circuit dies, said method comprising the steps of:

a) receiving dimensions for a die;

b) receiving a wafer size;

c) using only said wafer size, selecting a die count lookup table, wherein a first axis of said die count lookup table corresponds to a length-wise dimension for said die and a second axis of die count lookup table corresponds to a width-wise dimension for said die, said first axis and said second axis having increments of varying amounts; and d) determining from said selected die count lookup table, a die count corresponding to said dimensions.

11. The computer system of claim 10 wherein said method further comprises the steps of:

e) using only said wafer size, selecting a stepper shot count lookup table, wherein a first axis of said stepper shot count lookup table corresponds to a length-wise dimension for said die and a second axis of stepper shot count lookup table corresponds to a width-wise dimension for said die, said first axis and said second axis having increments of varying amounts; and f) determining from said selected stepper shot count lookup table, a stepper shot count corresponding to said dimensions.

12. The computer system of claim 11 wherein said method further comprises the steps of:

g) calculating a measure of die production using said die count and said stepper count;

h) receiving changed dimensions and repeating said steps a) through g) for said changed dimensions; and i) repeating said steps a) through h) until a maximum value of said measure of die production is determined.

13. The computer system of claim 12 wherein said dimensions comprise a die element size for said die, said die element size being a function of a scribe lane width, a guard ring width, an input/output pad area, and a length and a width of said die.

14. The computer system of claim 13 wherein said step c) of said method further comprises the steps of, for each wafer size:

c1) receiving a stepper field size;

c2) building a die matrix of reticle images using said die element size;

c3) calculating a die count for each of a plurality of different offsets of said die matrix, said offsets measured relative to a fixed location on a wafer;

c4) selecting an optimum die count from said step c3); and c5) storing said optimum die count in said die count lookup table, said optimum die count corresponding to said die element size.

15. The computer system of claim 14 wherein said method further comprises the steps of:

c6) calculating a stepper shot count for an offset corresponding to said optimum die count; and c7) storing said stepper shot count for said offset in said stepper shot count lookup table.

16. The computer system of claim 12 wherein said step g) of said method comprises the step of:

calculating said measure of die production by dividing said die count by said stepper shot count.

17. The computer system of claim 12 wherein said step h) of said method comprises the step of:

automatically rotating said dimensions for said die by 90 degrees when a width and a length of said die are not equal.

18. The computer system of claim 12 wherein said computer system is a server computer system in a client-server computer system network, said server computer system receiving said dimensions and said wafer size from a client computer system and providing said measure of die production to said client computer system.

19. A computer-usable medium having computer-readable program code embodied therein for causing a computer system to perform the steps of:

a) receiving dimensions for a die;

b) receiving a wafer size;

c) using only said wafer size, selecting a die count lookup table, wherein a first axis of said die count lookup table corresponds to a length-wise dimension for said die and a second axis of die count lookup table corresponds to a width-wise dimension for said die, said first axis and said second axis having increments of varying amounts; and d) determining from said selected die count lookup table, a die count corresponding to said dimensions.

20. The computer-usable medium of claim 19 wherein said computer-readable program code embodied therein causes a computer system to further perform the steps of:

e) using only said wafer size, selecting a stepper shot count lookup table, wherein a first axis of said stepper shot count lookup table corresponds to a length-wise dimension for said die and a second axis of stepper shot count lookup table corresponds to a width-wise dimension for said die, said first axis and said second axis having increments of varying amounts; and f) determining from said selected stepper shot count lookup table, a stepper shot count corresponding to said dimensions.

21. The computer-usable medium of claim 20 wherein said computer-readable program code embodied therein causes a computer system to further perform the steps of:

g) calculating a measure of die production using said die count and said stepper count;

h) receiving changed dimensions and repeating said steps a) through g) for said changed dimensions; and i) repeating said steps a) through h) until a maximum value of said measure of die production is determined.

22. The computer-usable medium of claim 21 wherein said dimensions comprise a die element size for said die, said die element size being a function of a scribe lane width, a guard ring width, an input/output pad area, and a length and a width of said die.

23. The computer-usable medium of claim 22 wherein said computer-readable program code embodied therein causes a computer system to further perform the steps of:
   c1) receiving a stepper field size;
   c2) building a die matrix of reticle images using said die element size;
   c3) calculating a die count for each of a plurality of different offsets of said die matrix, said offsets measured relative to a fixed location on a wafer;
   c4) selecting an optimum die count from said step c3); and
   c5) storing said optimum die count in said die count lookup table, said optimum die count corresponding to said die element size.

24. The computer-usable medium of claim 23 wherein said computer-readable program code embodied therein causes a computer system to further perform the steps of:
   c6) calculating a stepper shot count for an offset corresponding to said optimum die count; and
   c7) storing said stepper shot count for said offset in said stepper shot count lookup table.

25. The computer-usable medium of claim 21 wherein said computer-readable program code embodied therein causes a computer system to further perform the step of:
   calculating said measure of die production by dividing said die count by said stepper shot count.

26. The computer-usable medium of claim 21 wherein said computer-readable program code embodied therein causes a computer system to further perform the step of:
   automatically rotating said dimensions for said die by 90 degrees when a width and a length of said die are not equal.

27. The computer-usable medium of claim 21 wherein said computer-readable program code embodied therein is implemented in a server computer system in a client-server computer system network, said server computer system receiving said dimensions and said wafer size from a client computer system and providing said measure of die production to said client computer system.

* * * * *